(12) United States Patent
Patterson

(10) Patent No.: US 6,750,721 B2
(45) Date of Patent: Jun. 15, 2004

(54) HBT LINEARIZER AND POWER BOOSTER

(75) Inventor: Howard Patterson, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/136,926

(22) Filed: Apr. 30, 2002

(65) Prior Publication Data

US 2003/0201832 A1 Oct. 30, 2003

(51) Int. Cl.$^7$ ................................. H03F 3/68
(52) U.S. Cl. ........................ 330/295; 330/285
(58) Field of Search ................ 330/124 R, 285, 330/295, 296

(56) References Cited

U.S. PATENT DOCUMENTS

| | | | | |
|---|---|---|---|---|
| 5,670,912 A | * | 9/1997 | Zocher | 330/296 |
| 6,333,677 B1 | * | 12/2001 | Dening | 330/285 |
| 6,448,859 B2 | * | 9/2002 | Morizuka | 330/295 |
| 6,515,546 B2 | * | 2/2003 | Liwinski | 330/296 |
| 6,529,079 B2 | * | 3/2003 | Apel et al. | 330/296 |

* cited by examiner

Primary Examiner—Khanh Van Nguyen

(57) ABSTRACT

A power amplifier incorporates base ballasted heterojunction bipolar transistors (HBTs) in parallel. A transistor pair adjusts the voltage applied to the base ballast if it senses that the voltage appearing between one of the HBT transistors and its base ballast is drooping to a level not strong enough to keep the HBTs active.

16 Claims, 4 Drawing Sheets

HBT LINEARIZER AND POWER BOOSTER

FIELD OF THE INVENTION

This invention relates to power amplifiers and, more specifically, to a circuit and method for adjusting the voltage at the commonly connected ballasted ends of a plurality of base ballasted HBTs forming a power amplifier when the voltage appearing at one of the bases of the plurality of HBTs drops below a threshold.

BACKGROUND OF THE INVENTION

Hetero-junction bipolar transistor (HBT) power amplifiers are becoming the standard for cellular applications due to their high power density and reduction in die size. HBT's can draw substantial base current during high power operation. Since multi-finger power devices suffer from thermally related current collapse they cannot be operated without ballast resistors on either the emitter or base. Emitter ballasting is not practical for power amplifiers because of the high emitter currents and small resistor values, so base ballasting must be used. Because an individual HBT is a very small device, it is required to be paralleled with multiple HBTs to achieve high power operation required for most power amplifier applications.

Accordingly, HBT power amplifiers such as those used in radio frequency (RF) applications employ multiple small devices connected in parallel. As noted above, each of these small HBT devices require a ballast resistor to be connected to its base before being connected to the other HBTs forming the power amplifier (PA). The resistive ballasting of individual cells keeps parallel HBT fingers from entering thermal collapse. Additionally, a capacitor may be used to bypass the base resistor to preserve high frequency gain or the RF signal may be fed to the base connections through a separate capacitor. For purposes of illustration, the figures contained herein will illustrate the principal using capacitor bypassed ballast resistors although those skilled in the art will realize that this embodiment of the invention will work the same regardless of the connection of the RF capacitors feeding the base connection.

FIG. 1 shows a typical multi-fingered base ballasted Power Amplifier (PA) circuit. A plurality of HBTs 110, each ballasted with a resistor 130/capacitor 120 are connected in parallel. For each small HBT device, first ends 130a, 120a of a resistor 130 and a capacitor 120 are connected to the base 185 of the individual HBT devices and the other ends 130b, 120b of the resistor and the capacitor become the input 180 of each base ballasted HBT device 190. For purposes of simplicity, when two or more base ballasted HBT devices 190 are "connected in parallel", their collectors 160 share a first common node, their emitters 170 share a second common node connected to ground, and the inputs 180 share a third common node. A radio frequency signal is received at the input 140 and connected to the commonly connected inputs 180 of the base ballasted HBT devices 190. The commonly connected collectors 160 that are connected to a voltage source 155 produce an amplified RF output 150.

Due to the base current requirements, a biasing circuit 195 is usually included. Typical biasing circuits with RF decoupling components neglected for simplicity are shown in FIGS. 2 and 3. FIG. 2 shows a diode biasing circuit 200. The base of an HBT device 210 is connected to the collector and the collective inputs 180 of the of the base ballasted HBT devices 190 of FIG. 1. The emitter is connected to ground. The first end 220b of a reference resistor 220 is connected to the collector and base while the second end 220a of the reference resistor 220 is connected to a reference voltage 230.

FIG. 3 shows a preferred current mirror biasing circuit 300. A current mirror is formed by HBT devices 310 and 320. The collector of the first HBT device 310 is connected to a voltage source 350, its emitter is connected to the base of the second HBT device 320 and its base is connected to the collector of the second HBT device 320. The emitter of the second device is connected to ground. And finally, the first end 330b of a reference resistor 330 is connected to the base of the first HBT device 310 and the collector of the second HBT device 320 while the second end 330a of the reference resistor is connected to a reference voltage 340.

Although not exhaustive, these biasing circuits are typical of those employed in the industry although other types of biasing circuits are contemplated and may be used with the invention. The biasing circuits try to keep the current through the power device constant with variations in temperature and reference voltages. Although either of these biasing circuits or others could be used, current mirror biasing is typically preferred and will be used in the discussion.

Using the current mirror of FIG. 3 as the Bias of FIG. 1, the reference voltage 340 and the reference resistor 330 form a constant current source which is mirrored by the first HBT device 310 and the second HBT device 320. If no ballast resistors 130 were required, the current mirror would be adequate up to the limits of the HBT devices 310 and 320. However, with ballast resistors and during high power operation, the current mirror is unable to keep the voltage on the bases 185 of the individual HBT power device cells 110 constant because of the drop on the ballast resistor. In power operation when more HBTs are connected in parallel, increased base current is required from the current mirror. This strain on the current mirror results in increased voltage drops across the ballasting resistors 130 resulting in the voltage at the base of the individual HBT devices 110 to droop, limiting linearity and maximum output power.

What is required is an improved HBT power amplifier circuit that doesn't effect the quiescent point at lower output powers, but comes into play when higher powers are being generated that effectively prevents this drooping from occurring.

DETAILED DESCRIPTION OF THE PREFERRED EMBODIMENT

Figure 1:
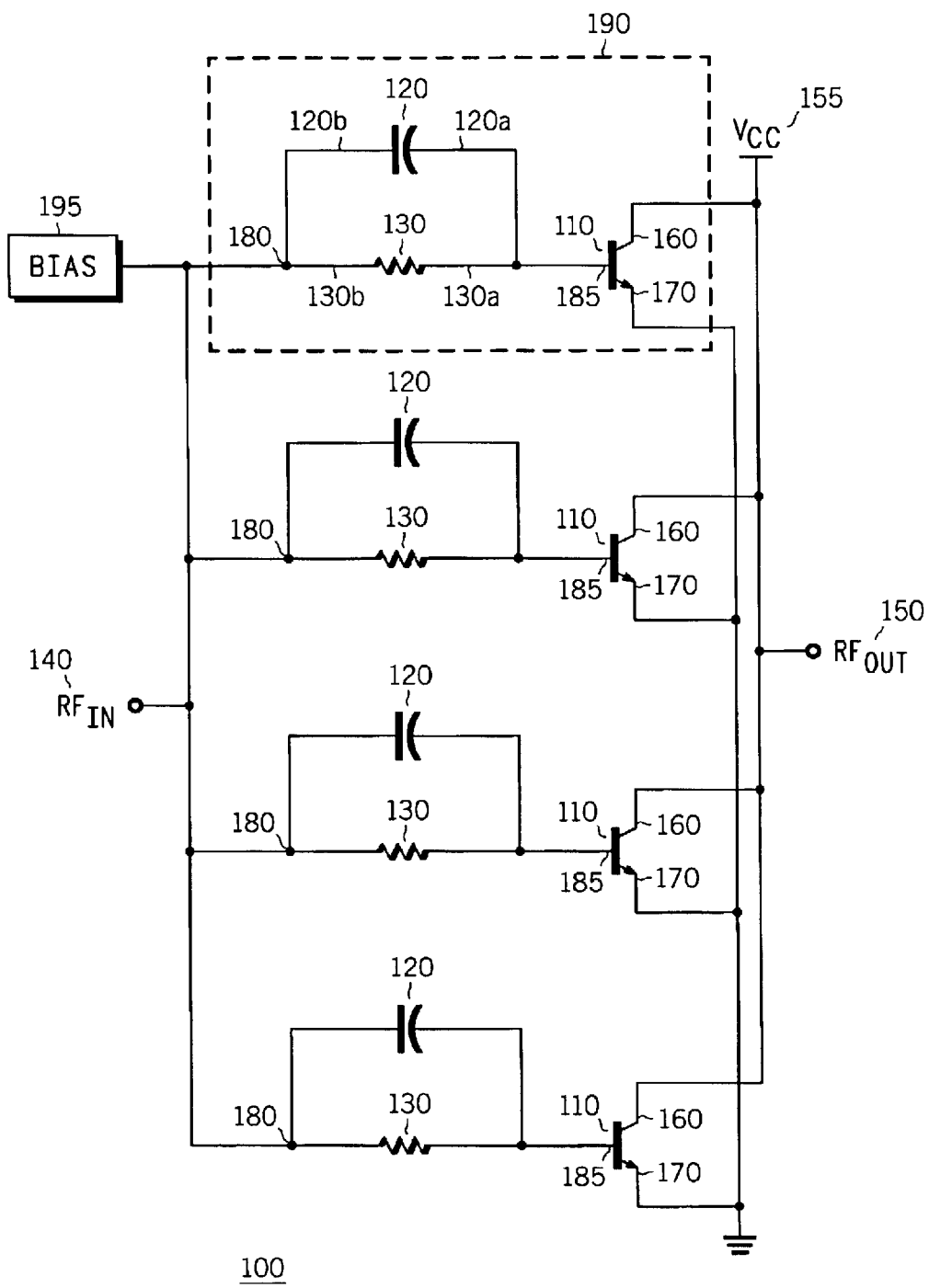
FIG. 1 is a simplified electrical schematic of a prior art base ballasted HBT power amplifier.
Figure 2:
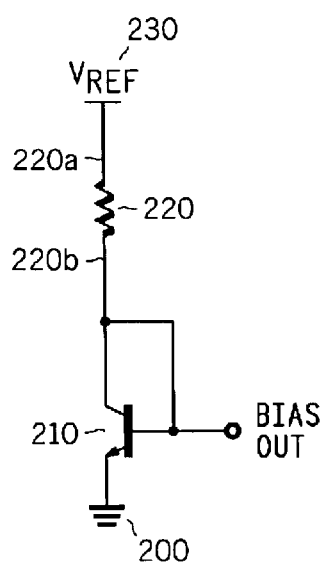
FIG. 2 is a simplified electrical schematic of a diode bias circuit occasionally used in HBT power amplifiers.
Figure 3:
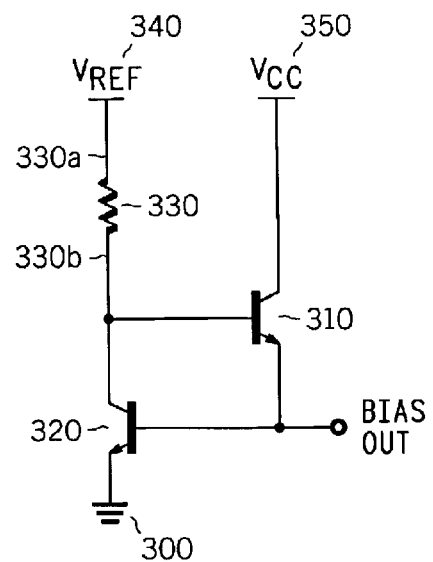
FIG. 3 is a simplified electrical schematic of a current mirror bias circuit typically used in HBT power amplifiers.
Figure 4:
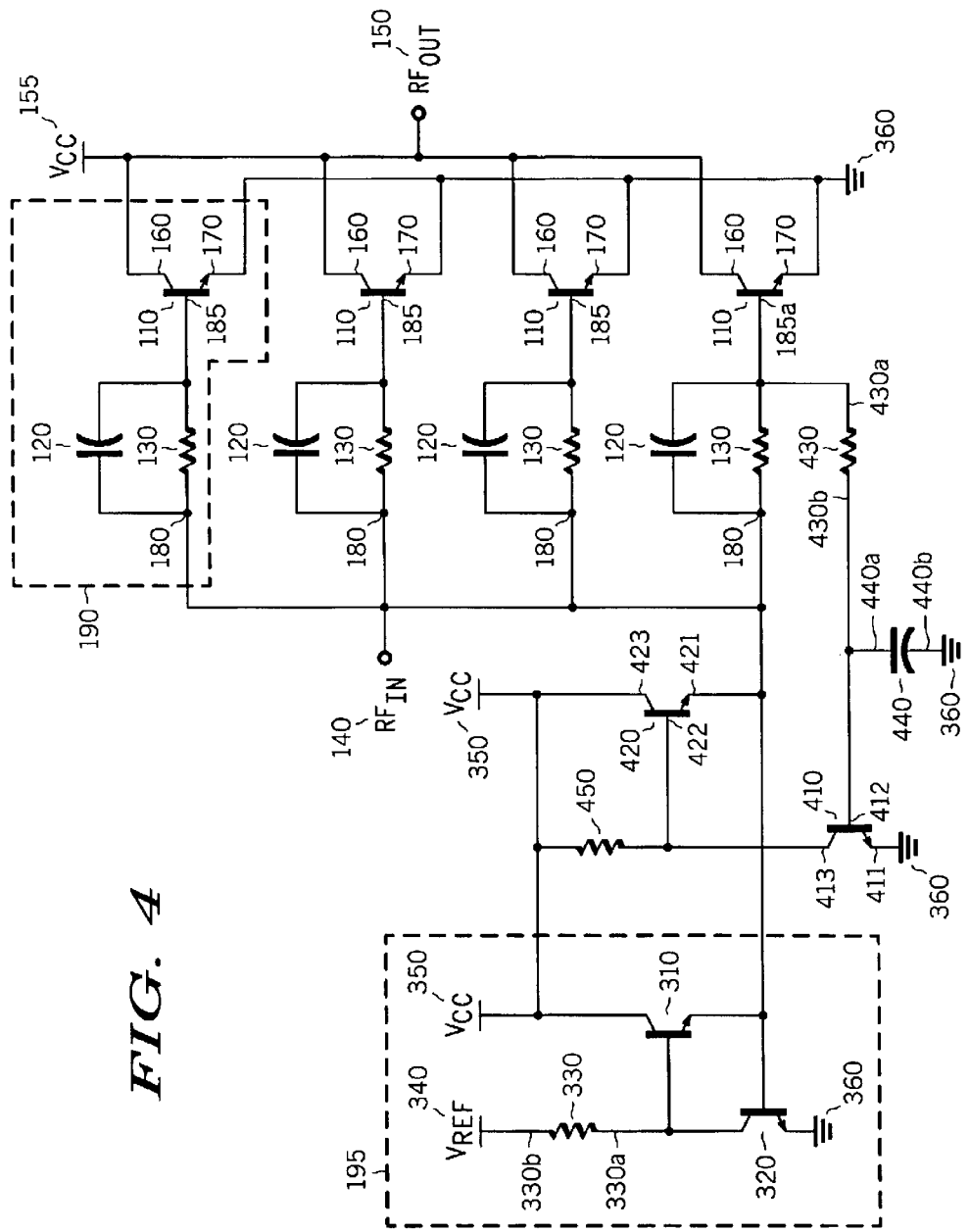
FIG. 4 are a simplified electrical schematic of a base ballasted HBT power amplifier including an HBT linearizer and power booster according to one embodiment of the invention.

Referring to FIG. 4, one model of an embodiment of a base ballasted HBT power amplifier with an HBT linearizer and Power Booster is shown. Similar reference numerals are used throughout the figures to represent similar features when possible.

A plurality of base ballasted HBT devices 190 are connected in parallel. Each of the ballasted HBT devices 190 have a ballast resistor 130 connected at one end to the base of the HBT cell 110 and the other producing an input 180 of the base ballasted HBT device 190. A ballast capacitor 120 may be connected across the ballast resistor as shown. Although the embodiment shown includes a resistor biasing scheme with a bypassing capacitor, other ballasting schemes are possible such as bringing in the RF signal to each base node through an individual capacitor, often called split ballasting. As split ballasting is well know in the industry, a detailed description is not included for simplicity. A plurality of base ballasted HBT devices 190 are connected in parallel such that their inputs 180 share a common node and receive an RF input signal, their collectors 160 are connected to a voltage source 155 and produce an RF output signal 150, and their emitters 170 share a node and are connected to ground.

At least one base 185*a* of one of the HBT devices is connected through a resistor 430 to a base 412 of an HBT transistor 410. The emitter 411 of this HBT transistor 410 is connected to ground 360 while the collector 413 is connected to a base 422 of another HBT transistor 420. The emitter 421 of the HBT transistor 420 is connected to the commonly connected inputs 180 of the base ballasted HBT devices 190 while the collector is connected to a voltage source 350. A resistor 450 is connected such that one end connects with the base 422 of HBT transistor 420 and collector 413 of HBT transistor 410 and the end of the resistor connects to the voltage source 350. A capacitor 440 is connected between the base 412 of the HBT transistor 410 and ground 360 such that resistor 430 and capacitor 440 form a low pass filter for the signal detected from at least one base 185*a* of one of the HBT devices 110 forming the power amplifier.

A bias circuit 195 of the current mirror type is connected such that the collector of the first HBT device 310 is connected to a voltage source 350, its emitter is connected to the base of the second HBT device 320 and its base is connected to the collector of the second HBT device 320. The emitter of the second device is connected to ground 360. And finally, the first end 330*b* of a reference resistor 330 is connected to the base of the first HBT device 310 and the collector of the second HBT device 320 while the second end 330*a* of the reference resistor is connected to a reference voltage 340.

In operation, the HBT device 410 senses the voltage appearing on one of the bases 185*a* of at least one of the HBT device cells 110 through the low pass filter formed by resistor 430 and capacitor 440. Resistor 450 is set such that at quiescent or low power operation, HBT device 420 supplies negligible current to the commonly connected inputs 180 of the base ballasted HBT devices 190 allowing the power device to be entirely controlled by the current mirror bias formed by HBT devices 310 and 320.

During high power operation, if the voltage on the base of the power HBT device cell 100 drops before a threshold, it is detected across the low pass filter by HBT device 410, which begins to turn off. As HBT device 410 begins to turn off it caused the base voltage appearing on the base 422 of HBT transistor 420 to increase. An increase voltage at the base 422 of HBT transistor 420 causes an increased voltage to appear on the emitter of HBT transistor 420 which drives the commonly connected inputs 180 of the base ballasted HBT devices 190. Thus, at high power operation, the voltage boost circuit created by HBT devices 410 and 420 takes over the power amplifier from the normal current mirror biasing circuit. Since this added circuitry supplies a higher voltage supply than the current mirror alone, it keeps the base bias at needed values further into compression and improves linearity and boosts power.

Figure 5:
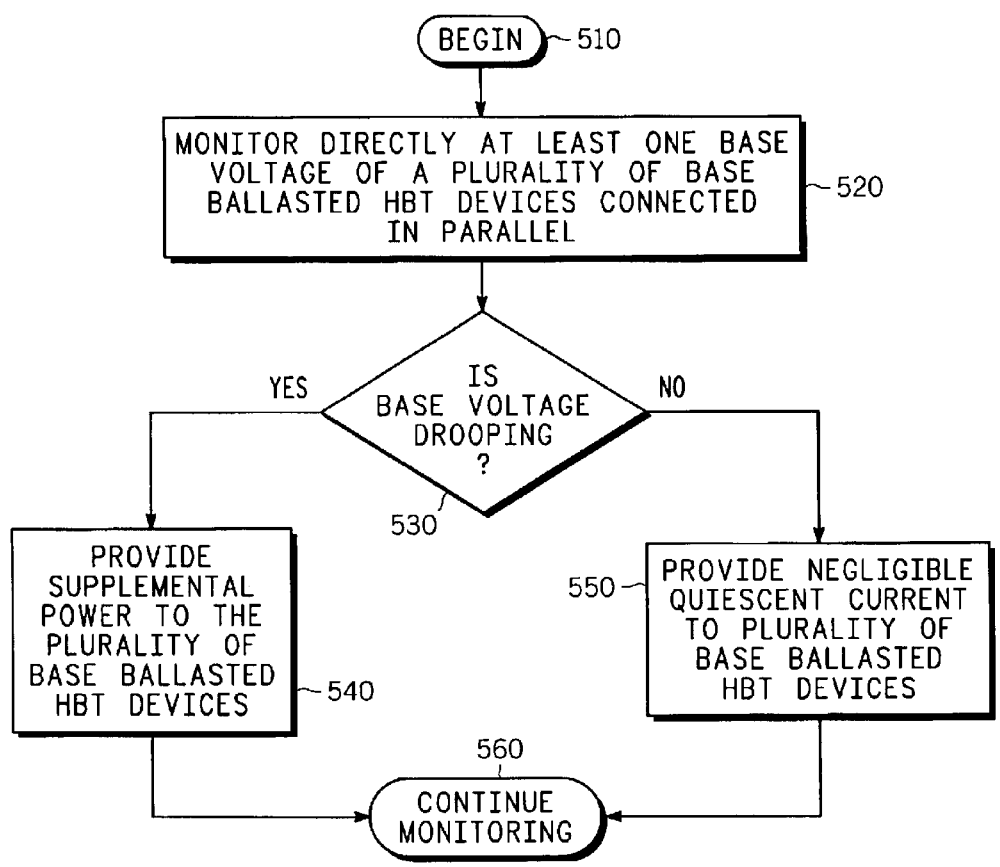
FIG. 5 is a flow chart demonstrating a method of increasing linearity and boosting power of an HBT power amplifier according to one embodiment of the invention.

FIG. 5 is a flowchart demonstrating a method of linearizing the HBT power amplifier and boosting power during dropping of high power operations according to one embodiment of the invention. When the circuit is on, in step 520, the power booster and linearizer constantly monitors the voltage appearing directly at the base of one of a plurality of base ballasted HBT devices connected in parallel where the base ballast of the individual HBT devices may cause a voltage difference to occur between the input to the plurality of base ballasted devices and the bases of the HBT cells. If the voltage appearing directly at the base of at least one of the HBT cells begins to drop below a threshold in step 530, the circuit provides supplemental power to the plurality of parallel connected base ballasted HBT devices in step 540, otherwise, the circuit passively provides negligible quiescent current to the plurality of base ballasted HBT devices. This allows the circuit to predictably run according to any well known bias that has been implemented to control the power amplifier.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An integrated circuit comprising:
    a plurality of hetero-junction bipolar transistors (HBTs) connected in parallel, each of the plurality of HBTs including a base ballast;
    a means for sensing a first voltage between one of the plurality of HBTs and its corresponding base ballast and adjusting a second voltage driving the plurality of HBTs commonly connected base ballast ends when the first voltage drops below a threshold.

2. An integrated circuit comprising:
    a plurality of hetero-junction bipolar transistors (HBTs) connected in parallel, each of the plurality of HBTs including a base ballast; and
    a means for sensing a first voltage between one of the plurality of HBTs and its corresponding base ballast and adjusting a second voltage driving the plurality of HBTs commonly connected base ballast ends when the first voltage drops below a threshold, wherein the base ballast comprises a resistor in parallel with a capacitor.

3. The integrated circuit of claim 2, wherein the means comprises:
    a first transistor having a base, an emitter and a collector wherein the first transistors base connects with a node between one of the plurality of the HBTs and its corresponding base ballast and the first transistors emitter connects with a grounding source; and
    a second transistor having a base, an emitter and a collector wherein the second transistors emitter connects to the plurality of HBTs commonly connected base ballast ends, the second transistors collector is connected to a voltage source, and the second transistors base connects to the first transistors collector and with the voltage source.

4. The integrated circuit of claim 3 wherein the means further includes a low pass filter with a first end connected to the node and a second end connected to the first transistor's base; and a resistor with a first end connected to the voltage source and a second end connected to the second transistor's base.

5. The integrated circuit of claim 4 wherein the low pass filter comprises a second resistor with a first end connected to the node and a second end connected to the first transistor's base; and a capacitor with a first end connected to the first transistor's base and a second end connected to the grounding source.

6. The integrated circuit of claim 2 further comprising a biasing component driving the plurality of HBTs commonly connected base ballast ends.

7. The integrated circuit of claim 6 wherein the biasing component is a diode bias circuit.

8. The integrated circuit of claim 7 wherein the diode bias circuit comprises: a first HBT with a base and collector connected to the plurality HBTs commonly connected base ballast ends and an emitter connected to a grounding voltage source; and a resistor with a first end connected to the collector and the base of the first HBT and a second end of the resistor connected to a reference voltage.

9. The integrated circuit of claim 6 wherein the biasing component is a current mirror biasing circuit.

10. The integrated circuit of claim 9 wherein the current mirror biasing circuit comprises:

a first transistor having a base, an emitter and a collector wherein the first transistor's emitter connects to a grounding source and the first transistor's base connects to the plurality of HBTs commonly connected base ballast ends;

a second transistor having a base, an emitter and a collector wherein the second transistor's emitter connects to the first transistor's base, the second transistor's base connects to the first transistor's collector, and the second transistor's collector connects to a first power source; and a reference resistor having a first end connected to the second transistor's base and a second end connected to a reference voltage.

11. An HBT linearizer and power booster circuit comprising:

a first transistor having a control terminal coupled to a base of one of a plurality of base ballasted transistors connected in parallel and having a common base ballast input, a first current carrying terminal, and a second current carrying terminal coupled with a grounding source;

a second transistor having a controlled terminal coupled with a first current carrying terminal of the first transistor, a first current carrying terminal connected with a voltage source and a second current carrying terminal connected to the common base ballast input of the plurality of the base ballasted transistors connected in parallel;

a resistor with a first end connected to the voltage source and a second end connected with the control terminal of the second transistor and the first current carrying terminal of the first transistor; and a low pass filter connected between the base and the control terminal of the first transistor wherein the low pass filter comprises a resistor with a first end connected to the base of a plurality of base ballasted transistors and a second end connected to the control terminal of the first transistor; and a capacitor with a first end connected to the control terminal of the first transistor and a second end connected to a grounding source.

12. The HBT linearizer and power booster circuit of claim 11, wherein each of the plurality of base ballasted transistors comprises a resistor with a first end connected to a control terminal of a transistor cell and a second end connected to the common base ballast input.

13. The HBT linearizer and power booster circuit of claim 12, wherein each of the plurality of base ballasted transistors further comprises a capacitor with a first end connected to the control terminal of the transistor cell and a second end connected to the common base ballast input.

14. A method of boosting power of a power amplifier operating at a high power comprising:

detecting a voltage occurring directly at a base of one of a plurality of base ballasted HBT devices connected in parallel and having a common base ballast input; and providing supplemental power at the common base ballast input when the detected voltage drops below a predetermined threshold.

15. A method of boosting power of a power amplifier operating at high power comprising:

detecting a voltage occurring directly on a base of one of a plurality of base ballasted HBT devices connected in parallel and having a common base ballast input; and providing supplemental power at the common base ballast input when the detected voltage drops below a predetermined threshold, wherein each of the plurality of base ballasted HBT devices comprises a resistor with a first end connected to a control terminal of a transistor cell and a second end connected to the common base ballast input.

16. The method of claim 15, wherein each of the plurality of base ballasted transistors further comprises a capacitor with a first end connected to the control terminal of the transistor cell and a second end connected to the common base ballast input.

* * * * *